(12) United States Patent
Choi et al.

(10) Patent No.: US 8,216,327 B2
(45) Date of Patent: Jul. 10, 2012

(54) METHOD FOR PREPARING CERIUM CARBONATE

(75) Inventors: Sang-Soon Choi, Samcheok-si (KR); Myoung-Hwan Oh, Daejeon (KR); Seung-Beom Cho, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 12/933,576

(22) PCT Filed: Mar. 18, 2009

(86) PCT No.: PCT/KR2009/001383
§ 371 (c)(1),
(2), (4) Date: Jan. 20, 2011

(87) PCT Pub. No.: WO2009/116806
PCT Pub. Date: Sep. 24, 2009

(65) Prior Publication Data
US 2011/0107680 A1    May 12, 2011

(30) Foreign Application Priority Data

Mar. 20, 2008 (KR) .................. 10-2008-0026010
Mar. 17, 2009 (KR) .................. 10-2009-0022715

(51) Int. Cl.
*B24D 3/02* (2006.01)
*C09C 1/68* (2006.01)
*C01F 17/00* (2006.01)

(52) U.S. Cl. ......................................... 51/307; 423/263
(58) Field of Classification Search .................. 51/307, 51/309; 423/263; 428/402
See application file for complete search history.

(56) References Cited

U.S. PATENT DOCUMENTS

2006/0162260 A1 * 7/2006 Nho et al. .................. 51/298

FOREIGN PATENT DOCUMENTS

| KR | 1020080011044 A | | 1/2008 |
| WO | 2007035034 A1 | | 3/2007 |
| WO | WO 2007/035034 | * | 3/2007 |

* cited by examiner

*Primary Examiner* — Anthony J Green
*Assistant Examiner* — Pegah Parvini
(74) *Attorney, Agent, or Firm* — Rothwell, Figg, Ernst & Manbeck, P.C.

(57) ABSTRACT

The present invention relates to a method for preparing cerium carbonate which enables preparation of hexagonal cerium carbonate by a simplified process, a cerium carbonate powder prepared thereby, and a method for preparing a cerium oxide powder using the same.

The method for preparing cerium carbonate comprises the step of contact-reacting orthorhombic cerium carbonate with a primary alcohol aqueous solution comprising water and primary alcohol at a weight ratio of 1:0.1 or more at a temperature of 160° C. or more to form hexagonal cerium carbonate.

14 Claims, 2 Drawing Sheets

US 8,216,327 B2

METHOD FOR PREPARING CERIUM CARBONATE

CROSS REFERENCE TO RELATED APPLICATIONS

This application is a 35 U.S.C. §371 National Phase Entry Application from PCT/KR2009/001383, filed Mar. 18, 2009, and designating the United States, which claims priority under 35 U.S.C. §119 to Korean Patent Application No. 10-2008-0026010 filed Mar. 20, 2008 and to Korean Patent Application No. 10-2009-0022715 filed Mar. 17, 2009, which are incorporated herein in their entireties.

BACKGROUND OF THE INVENTION (a) Field of the Invention

The present invention relates to a method for preparing cerium carbonate, a cerium carbonate powder, and a method for preparing a cerium oxide powder using the same. More specifically, the present invention relates to a method for preparing cerium carbonate which enables preparation of hexagonal cerium carbonate by a simplified process, a cerium carbonate powder prepared thereby, and a method for preparing a cerium oxide powder using the same.

(b) Description of the Related Art

Cerium oxide is high functional ceramic material widely used as a catalyst, phosphor, cosmetics, abrasive, etc., and, recently, it is spotlighted as an abrasive for CMP (Chemical Mechanical Polishing) process in the field of semiconductor device.

The cerium oxide is generally prepared by a liquid-phase method, a gas-phase method or a solid-phase method.

According to the liquid-phase method, a pH controlling agent such as ammonia is added to starting material, i.e., trivalent or tetravalent cerium salt to directly prepare cerium oxide from cerium salt. Although this method is economical because raw material cost and equipment cost is comparatively low, it is difficult to control particle growth because reaction between starting materials easily occurs from nucleation stage. And, if fine cerium oxide prepared by the liquid-phase method is used as an abrasive, polishing rate is low thus disadvantageous for a continuous process and decreasing productivity.

According to the gas-phase method, a cerium metal salt precursor is vaporized and then combined with oxygen, etc. to directly prepare cerium oxide. This method includes flame combustion decomposition, gas condensation decomposition, plasma vaporization, laser vaporization, etc. However, this method has difficulty in terms of massification because costs of the cerium metal salt precursor and equipment are high, and the study thereof is still under progress.

Meanwhile, according to the solid-phase method, precursor material is sintered at high temperature to prepare cerium oxide. As the precursor, cerium carbonate is widely used, and the property and shape of cerium oxide change according to the kind and shape of cerium carbonate. Thus, in order to control the property, shape, abrasiveness, etc. of cerium oxide abrasive, it is required to control the kind or shape of precursor cerium carbonate.

However, a method for preparing cerium carbonate with controlling the kind or shape of cerium carbonate by a simplified process has not been adequately developed yet, and particularly, there is a continued demand for a method capable of preparing hexagonal cerium carbonate by more simplified process.

SUMMARY OF THE INVENTION

The present invention provides a method for preparing cerium carbonate which enables preparation of hexagonal cerium carbonate by more simplified process, and a cerium carbonate powder prepared thereby.

Also, the present invention provides a method for preparing a cerium oxide powder using the cerium carbonate powder.

Further, the present invention provides CMP (Chemical Mechanical Polishing) slurry comprising cerium oxide powder prepared by the above method.

Specifically, the present invention provides a method for preparing cerium carbonate comprising the step of contact-reacting orthorhombic cerium carbonate with a primary alcohol aqueous solution comprising water and primary alcohol at a weight ratio of 1:0.1 or more at a temperature of 160° C. or more to form hexagonal cerium carbonate.

The present invention also provides a cerium carbonate powder prepared by the above method, comprising orthorhombic cerium carbonate and hexagonal cerium carbonate at a volume ratio of 99:1 to 0:100.

Also, the present invention provides a method for preparing a cerium oxide powder comprising the step of sintering the above cerium carbonate powder.

The present invention also provides CMP (Chemical Mechanical Polishing) slurry comprising the cerium oxide powder prepared by the above method as an abrasive.

DETAILED DESCRIPTION OF THE EMBODIMENTS

Figure 1:
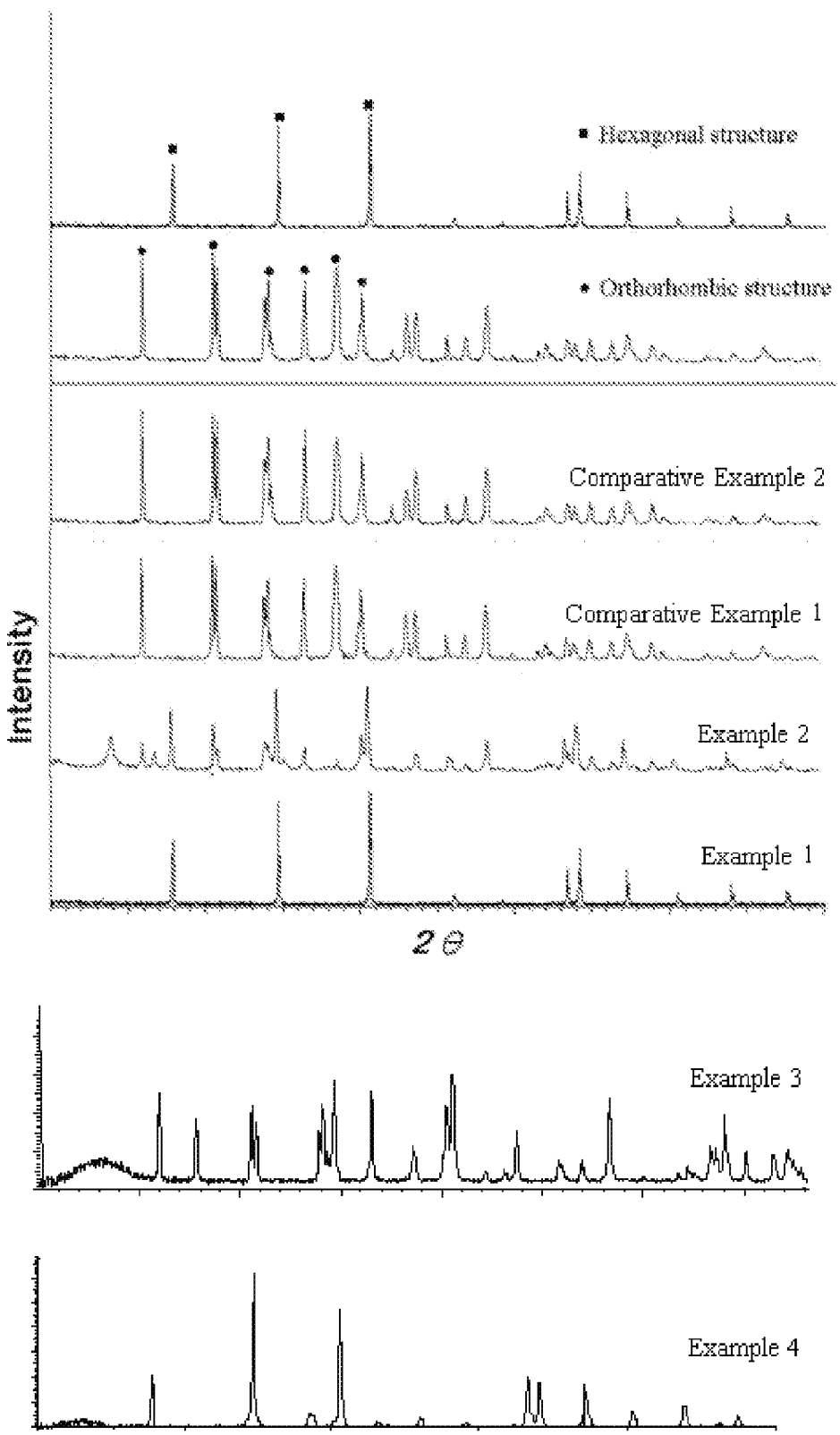
FIG. 1 shows XRD analysis results of cerium carbonate powders prepared in Examples 1 to 4, Comparative Examples 1 and 2, and XRD reference value of orthorhombic cerium carbonate and hexagonal cerium carbonate.

A method for preparing cerium carbonate, cerium carbonate powder, a method for preparing cerium oxide powder, and CMP slurry according to specific embodiments of the invention will now be explained.

According to one embodiment of the invention, a method for preparing cerium carbonate comprising the step of contact-reacting orthorhombic cerium carbonate with a primary alcohol aqueous solution comprising water and primary alcohol at a weight ratio of 1:0.1 or more at a temperature of 160° C. or more to form hexagonal cerium carbonate is provided.

As results of experiments of the present inventors, it was found that the contact reaction of orthorhombic cerium carbonate with a primary alcohol aqueous solution comprising water and primary alcohol at a specific weight ratio at a given temperature affords conversion of crystal structure of cerium carbonate thus forming hexagonal cerium carbonate.

Thus, according to this embodiment, hexagonal cerium carbonate which was difficult to be prepared can be prepared from orthorhombic cerium carbonate which can be relatively easily obtained by more simplified process. Particularly, according to this method, a conversion rate from orthorhombic cerium carbonate to hexagonal cerium carbonate can be easily controlled by controlling conditions of the contact reaction such as temperature, weight ratio of water and primary alcohol or contents (weight ratio) of a primary alcohol aqueous solution and cerium carbonate, etc. Therefore, preparation with controlling the kind or shape of cerium carbonate by simple process is enabled, and cerium oxide having appropriate property or shape can be easily prepared from the cerium carbonate and applied for CMP slurry.

The method for preparing cerium carbonate according to the embodiment of the invention will be explained in detail.

The crystal structure of cerium carbonate is divided into orthorhombic or hexagonal according to the amounts of hydroxide group bound to carbonate functional group, and they can be prepared by precipitation reaction of cerium precursor and carbonate precursor. It is expected that orthorhombic cerium carbonate is produced according to the following Reaction Formula 1, and hexagonal cerium carbonate is produced according to the following Reaction Formula 2.

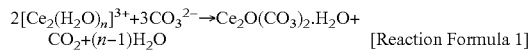
[Reaction Formula 1]

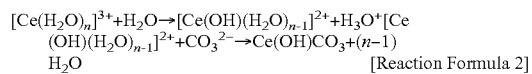
[Reaction Formula 2]

Thus, generally, reaction conditions were changed in order to control the crystal structure of cerium carbonate. However, although orthorhombic cerium carbonate is known to be relatively easily prepared by common precipitation reaction in an aqueous solution at a comparatively low temperature, it was difficult to prepare hexagonal cerium carbonate in an aqueous solution.

Specifically, for the formation of hexagonal cerium carbonate, a cerium precursor such as cerium salt and urea are dissolved in water and reacted. In order to form hexagonal cerium carbonate by the reaction, weak hydrolysis of Ce ion should occur before $CO_3^{2-}$ is combined to Ce ion (see the above Reaction Formula 2), thus it is required to conduct the above reaction at high temperature. However, since urea may be decomposed at high temperature to generate ammonia and carbon dioxide, etc., which may generate gas pressure, the above reaction had to be conducted under very high pressure, for example, pressure almost reaching 100 bar.

However, if the reaction is conducted under high pressure, riskiness due to high pressure is inevitably involved, and the use of expensive equipment decreases economical efficiency.

According to one embodiment of the invention, hexagonal cerium carbonate can be prepared simply by contact-reacting orthorhombic cerium carbonate with a primary alcohol aqueous solution comprising water and primary alcohol at a specific weight ratio at a given temperature. Thus, since there is no need to use urea, hexagonal cerium carbonate can be obtained under a pressure not so high. And, hexagonal cerium carbonate can be obtained by more simplified process comprising contact-reacting orthorhombic cerium carbonate with a primary alcohol aqueous solution.

Therefore, the method according to one embodiment of the invention can largely contribute to improvement in economical efficiency and practicality of preparation process of hexagonal cerium carbonate. And, cerium carbonate of desired kind and shape can be easily obtained by converting orthorhombic cerium carbonate to hexagonal carbonate partially or wholly.

In the method for preparing cerium carbonate according to one embodiment, the contact reaction between the orthorhombic cerium carbonate and the primary alcohol aqueous solution is conducted at 160° C. or more, preferably 160~230° C. As results of experiments of the present inventors, it was found that if the contact reaction temperature is less than 160° C., reactivity of the orthorhombic cerium carbonate and primary alcohol aqueous solution is low, thus hexagonal cerium carbonate conversion rate is largely decreased, or hexagonal cerium carbonate conversion occurs little. To the contrary, if the contact reaction temperature exceeds 230° C., reaction pressure may be increased too much for increasing reaction temperature, and additional effects for increasing hexagonal cerium carbonate conversion rate are not significant.

And, weight ratio of the orthorhombic cerium carbonate and the primary alcohol aqueous solution is preferably 1:0.5 to 1:100. If the weight ratio of the primary alcohol aqueous solution to the orthorhombic cerium carbonate is less than the above range, orthorhombic cerium carbonate may be converted to cerium oxide. If the weight ratio of the primary alcohol aqueous solution to the orthorhombic cerium carbonate is higher than the above range, hexagonal cerium carbonate conversion rate may be decreased.

The contact time of the orthorhombic cerium carbonate and the primary alcohol aqueous solution can be controlled according to the composition of primary alcohol aqueous solution, weight ratio of orthorhombic cerium carbonate and primary alcohol aqueous solution, reaction temperature, etc. considering required hexagonal cerium carbonate conversion rate. Preferably, it is controlled within 1 hour to 60 hours. For example, hexagonal cerium carbonate conversion time can be decreased by increasing the amount of alcohol in the primary alcohol aqueous solution or decreasing the weight ratio of the orthorhombic cerium carbonate to the primary alcohol aqueous solution.

And, the weight ratio of the primary alcohol and water in the primary alcohol aqueous solution is 1:0.1 or more, preferably 1:0.1 to 1:4. As results of experiments, it was found that if the weight ratio of water and primary alcohol is less than 1:0.1, hexagonal cerium carbonate conversion rate is largely decreased, or hexagonal cerium carbonate conversion occurs little. To the contrary, if the weight ratio of water and primary alcohol exceeds 1:4, reaction pressure may be increased too much, and additional effects for increasing hexagonal cerium carbonate conversion rate are not significant.

The primary alcohol comprised in the primary alcohol aqueous solution is not specifically limited only if it is has one alkyl group substituted for carbinol carbon. Examples thereof include methanol, ethanol, propanol, butanol, etc. without limitations, and ethanol or butanol is preferable.

The orthorhombic cerium carbonate that is contact-reacted with the primary alcohol aqueous solution is in the form of $Ce_2O(CO_3)_2 \cdot H_2O$, and it can be prepared by common method known in the art including precipitation reaction of cerium precursor and carbonate precursor as shown in the above Reaction Formula 1.

As the cerium precursor, cerium salt comprising trivalent or tetravalent cerium can be used. Examples thereof include cerium nitrate ($Ce(NO_3)_3 \cdot xH_2O$), cerium sulfate ($Ce(SO_4)_3 \cdot xH_2O$ or $Ce(SO_4)_2 \cdot xH_2O$), cerium chloride ($CeCl_3 \cdot xH_2O$) or diammonium cerium nitrate($Ce(NH_4)_2(NO_3)_6$ or $Ce(NH_4)_2(NO_3)_5 \cdot xH_2O$) (wherein, x is constant of from 0 to 10).

As the carbonate precursor, urea ($CO(NH_2)_2$) or carbonate salt can be used, and it may also function as a pH controlling agent.

Meanwhile, it is preferable to further comprise the steps of separating, washing and drying the above prepared hexagonal cerium carbonate. The separation may be conducted by common separation method in the art, for example, separation by cooling or centrifugal separation. The washing is preferably conducted using DI water such that ion value may be 3 mS or less. Thereby, crystal size of sintered powder can be suitably controlled, and difficulties involved in milling can be prevented. The drying is preferably conducted at 60° C. or more for 24 hours.

According to the method for preparing cerium carbonate as described above, hexagonal cerium carbonate can be prepared by simple contact reaction of a primary alcohol aqueous solution and orthorhombic cerium carbonate. Particularly, a cerium carbonate powder comprising orthorhombic cerium carbonate and hexagonal cerium carbonate at an appropriate ratio can be obtained by changing reaction conditions of the contact reaction, for examples, composition of the primary ethanol aqueous solution, weight ratio of orthorhombic cerium carbonate and primary ethanol aqueous solution, or reaction temperature range, thereby controlling conversion rate of orthorhombic cerium carbonate to hexagonal cerium carbonate. Thereby, a cerium carbonate powder of suitably controlled kind and shape can be obtained, and a cerium oxide powder with desired property and shape can be obtained therefrom and CMP slurry comprising the same can be easily obtained According to another embodiment of the invention, a cerium carbonate powder prepared by the above method is provided. The cerium carbonate powder may comprise orthorhombic cerium carbonate and hexagonal cerium carbonate at various ratios by the above method. For example, it may comprise orthorhombic cerium carbonate and hexagonal cerium carbonate at various volume ratios within a range of from 99:1 to 0:100, preferably from 50:50 to 0:100.

Specifically, since the ratio of orthorhombic cerium carbonate and hexagonal cerium carbonate can be variously and easily controlled, desired kind and shape of cerium carbonate powder can be easily obtained. Thereby, a cerium oxide powder satisfying preferred property and shape as a CMP abrasive can be easily obtained.

According to another embodiment of the invention, a method for preparing a cerium oxide powder comprising the step of sintering the above cerium carbonate powder is provided.

The sintering may be conducted by common sintering method for preparing cerium oxide powder known in the art. For example, it may comprise the step of heating at 600 to 1200° C. And, the sintering is preferably conducted for 30 minutes~4 hours. If the sintering time is less than 30 minutes, crystallinity of the prepared cerium oxide powder is low thus decreasing polishing rate when used as a CMP abrasive. If the sintering time exceeds 4 hours, crystal growth of cerium oxide is excessive thus causing serious scratch on the polished surface when used as an abrasive.

By controlling the volume ratio of orthorhombic cerium carbonate and hexagonal cerium carbonate in the precursor cerium carbonate powder (conversion rate of orthorhombic cerium carbonate to hexagonal cerium carbonate), the obtained cerium oxide powder can manifest desired polishing property. For example, a cerium oxide powder (or abrasive) prepared from hexagonal cerium carbonate as a precursor has high polishing rate for silicon oxide film and low polishing rate for silicon nitride film, thus having excellent polishing selectivity between a silicon oxide film and a silicon nitride film as well as excellent global planarization. And, a cerium oxide powder (or abrasive) prepared from orthorhombic cerium carbonate as a precursor is advantageous for polishing of a silicon nitride film having high strength.

Therefore, according to the above embodiment, by controlling a volume ratio of orthorhombic cerium carbonate and hexagonal cerium carbonate in a precursor cerium carbonate powder, for example, within a range of from 99:1~0:100, polishing property of cerium oxide powder as an abrasive, polishing rate for a silicon oxide film, polishing rate for a silicon nitride film, polishing selectivity between a silicon oxide film and a silicon nitride film or global planarization, etc. can be easily controlled.

According to another embodiment of the present invention, a CMP slurry comprising the above cerium oxide powder as an abrasive is provided. The CMP slurry comprises the cerium oxide powder as an abrasive, and it may further comprise a dispersant and/or water.

The content of the cerium oxide powder in the slurry is preferably 0.1 to 50 parts by weight, based on 100 parts by weight of the slurry. If the content of the abrasive cerium oxide powder is less than 0.1 parts by weight in the slurry, it is difficult to polish a surface to be polished, and if the content exceeds 50 parts by weight, a viscosity of the slurry increases to lowering dispersion stability.

And, the dispersant is preferably contained in an amount of 0.5 to 10 parts by weight, based on 100 parts by weight of the abrasive. If the content of the dispersant is less than 0.5 parts by weight, dispersion ability is low thus accelerating precipitation, and thus precipitation may occur when transferring the slurry, which may cause non-uniform provision of the abrasive. If the content of the dispersant exceeds 10 parts by weight, a dispersant layer functioning as a cushion forms thickly around abrasive particles, and thus the surface of an abrasive is difficult to be contacted to the surface to be polished thus decreasing polishing rate.

As the dispersant, non-ionic polymer dispersant or anionic polymer dispersant can be used. The non-ionic polymer dispersant may be selected from the group consisting of polyvinyl alcohol (PAA), ethylene glycol (EG), glycerin, polyethylene glycol (PEG), polypropylene glycol (PPG), polyvinyl pyrrolidone (PVP) and a mixture thereof, and the anionic polymer dispersant may be selected from the group consisting of polyacrylic acid, polyacrylic acid ammonium salt, polyacryl maleic acid and a mixture thereof. However, the dispersant is not limited thereto, and various dispersants known to be useable for CMP slurry can be used without limitations.

Preferably, the CMP slurry is titrated to pH 6 to 8, after mixing the cerium oxide powder, dispersant and water. The titration may be conducted using 1N KOH or 1N $HNO_2$.

After pH titration, in order to improve dispersion and storage stability, dispersion stabilization process is preferably conducted. The dispersion stabilization process is preferably conducted by wet milling dispersion method capable of exactly and finely controlling particle size, for example, ball mill, attrition mill, etc.

The CMP slurry composition finally prepared by the dispersion stabilization preferably has particle size distribution of less than 3 µm, and average particle size of 50 to 1000 nm. If the average particle size is less than 50 nm, polishing rate for the surface to be polished is too low, and if it exceeds 1000 nm, fine scratch of the polished surface may be generated or storage stability of the slurry may be deteriorated. The particle size distribution is as measured by a particle size distribution analyzer (Horiba LA-910).

The CMP slurry may further comprise other additives for improving polishing performance or dispersion stability.

EXAMPLES

The invention is further explained in more detail with reference to the following examples. These examples, however, should not be interpreted as limiting the scope of the invention in any manner.

Preparation of Cerium Carbonate Powder

Example 1

Water and ethanol were mixed at a weight ratio of 1:0.11 to prepare an ethanol aqueous solution, and then, the ethanol aqueous solution and orthorhombic cerium carbonate were introduced in a reactor at a weight ratio of 10:1, and agitated for 10 hours. The reaction temperature was adjusted to 200° C., and agitation speed was adjusted to 200 rpm.

XRD analysis of the prepared cerium carbonate powder was conducted, and the result was shown in FIG. 1. From the result, it was confirmed that the whole orthorhombic cerium carbonate was converted to hexagonal cerium carbonate.

Example 2

A cerium carbonate powder was prepared by the same method as Example 1, except that the weight ratio of the ethanol aqueous solution and orthorhombic cerium carbonate was changed to 1:0.67 instead of 10:1.

XRD analysis of the prepared cerium carbonate powder was conducted, and the result was shown in FIG. 1. And, a volume ratio of orthorhombic cerium carbonate and hexagonal cerium carbonate comprised in the cerium carbonate powder was calculated by calibration curve method, and the result was shown in the following Table 1. From the results, it was confirmed that a part of orthorhombic cerium carbonate was converted to hexagonal cerium carbonate.

Example 3

Water and ethanol were mixed at a weight ratio of 1:1 to prepare an ethanol aqueous solution, and then, the ethanol aqueous solution and orthorhombic cerium carbonate were introduced in a reactor at a weight ratio of 1:0.3, and agitated for 10 hours. The reaction temperature was adjusted to 180° C., and agitation speed was adjusted to 200 rpm.

XRD analysis of the prepared cerium carbonate powder was conducted, and the result was shown in FIG. 1. And, a volume ratio of orthorhombic cerium carbonate and hexagonal cerium carbonate comprised in the cerium carbonate powder was calculated by calibration curve method, and the result was shown in the following Table 1. From the results, it was confirmed that a part of orthorhombic cerium carbonate was converted to hexagonal cerium carbonate.

Example 4

Water and butanol were mixed at a weight ratio of 1:1 to prepare an butanol aqueous solution, and then, the butanol aqueous solution and orthorhombic cerium carbonate were introduced in a reactor at a weight ratio of 10:1, and agitated for 10 hours. The reaction temperature was adjusted to 200° C., and agitation speed was adjusted to 200 rpm.

XRD analysis of the prepared cerium carbonate powder was conducted, and the result was shown in FIG. 1. From the result, it was confirmed that the whole orthorhombic cerium carbonate was converted to hexagonal cerium carbonate.

Comparative Examples 1-2

A cerium carbonate powder was prepared by the same method as Example 1, except that the composition of the ethanol aqueous solution, weight ratio of orthorhombic cerium carbonate and ethanol aqueous solution, or reaction temperature was changed as shown in the following Table 1.

XRD analysis of the prepared cerium carbonate powder was conducted, and the result was shown in FIG. 1 together with the results of Examples 1 and 2. From the results, it was confirmed that in Comparative Examples 1 and 2, crystal structure of cerium carbonate was not converted.

TABLE 1

|  | Composition of ethanol aqueous solution (weight ratio of water:ethanol or butanol) | Weight ratio of orthorhombic cerium carbonate:alcohol aqueous solution | Reaction temperature | Crystal structure of cerium carbonate powder |
|---|---|---|---|---|
| Example 1 | 1:0.11 | 1:10 | 200° C. | Hexagonal (100 vol %) |
| Example 2 | 1:0.11 | 0.67:1 | 200° C. | Orthorhombic (40 vol %)/ Hexagonal (60 vol %) |
| Example 3 | 1:1 | 0.3:1 | 180° C. | Orthorhombic (40 vol %)/ Hexagonal (60 vol %) |
| Example 4 | 1:1 | 1:10 | 200° C. | Hexagonal (100 vol %) |
| Comparative Example 1 | 1:0.05 | 1:10 | 200° C. | Orthorhombic |
| Comparative Example 2 | 1:0.11 | 1:10 | 150° C. | Orthorhombic |

From the Table 1, it was confirmed that a whole or a part of orthorhombic cerium carbonate can be converted to hexagonal cerium carbonate by contact-reacting orthorhombic cerium carbonate with a primary alcohol aqueous solution comprising water and primary alcohol at a weight ratio of 1:0.1 or more at a temperature of 160° C. or more. To the contrary, in case the above temperature condition or composition of the primary alcohol aqueous solution was not satisfied as in Comparative Example 1 or 2, orthorhombic cerium carbonate was not converted.

And, from the Examples 1 to 4, it was confirmed that by controlling contact reaction conditions of the orthorhombic cerium carbonate and primary alcohol aqueous solution, conversion rate of orthorhombic cerium carbonate to hexagonal cerium carbonate can be controlled to obtain cerium carbonate powder comprising orthorhombic cerium carbonate and hexagonal cerium carbonate at desired ratio.

Preparation of Cerium Oxide Powder

Example 5

Figure 2:
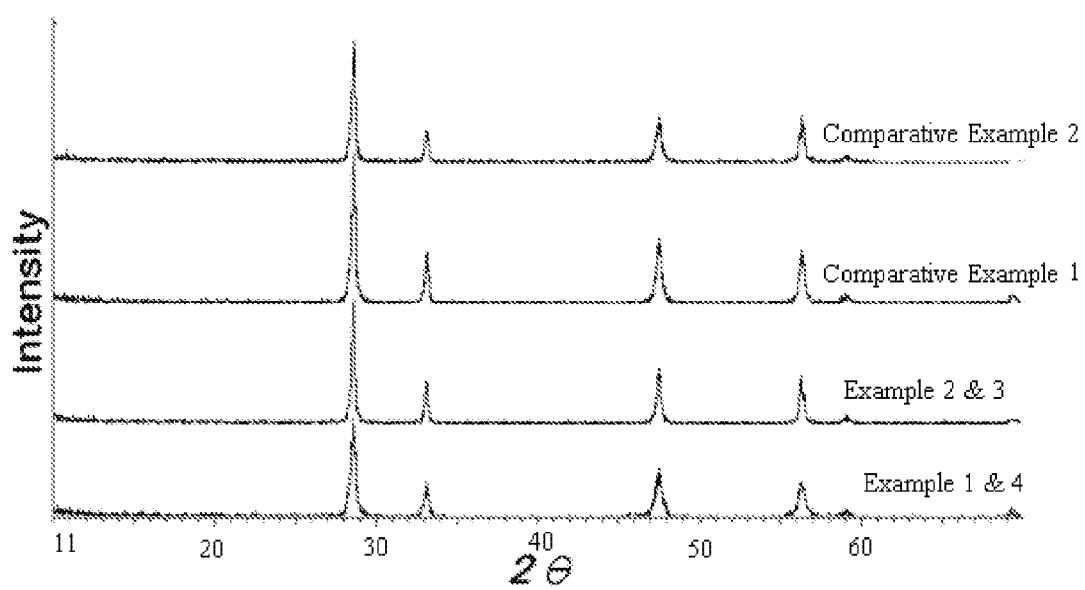
FIG. 2 shows XRD analysis results of cerium oxide powder prepared from the cerium carbonate powders of Examples 1 to 4, Comparative Example 1 and 2, according to Example 5.

The cerium carbonate powders prepared in Example 1 to 4, Comparative Examples 1 and 2 were heated at 900° C. for 2 hours to prepare cerium oxide powders, and XRD analysis was conducted and the results were shown in FIG. 2. From the results, it was confirmed that the cerium carbonate powder was changed to cerium oxide.

Preparation of CMP Slurry

Example 6

0.5 kg of each cerium oxide powder prepared in the Example 3, 25 g of polyacrylic acid dispersant (Aldrich) and 5 L of pure water were mixed to prepare cerium oxide dispersion. The prepared cerium oxide dispersion was titrated using ammonia water to pH 7.0, and then, dispersion stability improving and particle size distribution control processes were conducted with ball mill. The ball-mill was conducted at 250 rpm for 2 hours using 100 g of 1 mm zirconia bead.

The dispersion was filtered with 1 μm filter, and then, pure water was added thereto such that the content of the cerium oxide powder may be 1 part by weight per 100 parts by weight of total slurry, to prepare a CMP slurry. The cerium oxide has an average particle size of 176 nm, and particle size distribution of about 70~300 nm as measured by particle size distribution analyzer (Horiba LA-910).

Experiment 1: Evaluation of Polishing Performance

Each CMP slurry prepared in the Example 6 was used for polishing under the following conditions for 1 minute, and then, the substrate was washed, and thickness change resulting from the polishing was measured to evaluate polishing performance. The results were shown in the following Table 2.

[Polishing Conditions]
 Polishing equipment: GNP POLY 400 (GNP Technology)
 Pad: polyurethane type
 Platen speed: 90 rpm
 Carrier speed: 90 rpm
 Pressure: 4 psi
 Slurry flow rate: 100 ml/min
[Polished Object]
 silicon oxide film forming wafer deposited with a thickness of 7000 Å by PECVD (plasma enhanced chemical vapor deposition)
 silicon nitride film forming wafer deposited with a thickness of 1500 Å by LPCVD (Low pressure chemical vapor deposition)
[Evaluation]
 Change of thickness before and after polishing was measured with Nanospec 6100 (Nanometeics Company).
 Delta WIWNU (Within Wafer Non-Uniformity) was calculated by Standard deviation method (ASTM).

What is claimed is:

1. A method for preparing cerium carbonate comprising the step of contact-reacting orthorhombic cerium carbonate with a primary alcohol aqueous solution comprising water and primary alcohol at a weight ratio of 1:0.1 or more at a temperature of 160° C. or more to form hexagonal cerium carbonate.

2. The method according to claim 1, wherein the contact reaction is conducted at a temperature of from 160° C. to 230° C.

3. The method according to claim 1, wherein the orthorhombic cerium carbonate and the primary alcohol aqueous solution is contact-reacted at a weight ratio of 1:0.5 to 1:100.

4. The method according to claim 1, wherein the primary alcohol aqueous solution comprises water and primary alcohol at a weight ratio of 1:0.1 to 1:4.

5. The method according to claim 1, wherein the contact reaction is conducted for 1 to 60 hours.

6. The method according to claim 1, further comprising the step of precipitation-reacting a cerium precursor with a carbonate precursor to form orthorhombic cerium carbonate, before the step of contact reaction.

7. The method according to claim 1, wherein the primary alcohol aqueous solution comprises an ethanol or butanol aqueous solution.

8. A cerium carbonate powder prepared by the method according to claim 1, comprising orthorhombic cerium carbonate and hexagonal cerium carbonate at a volume ratio of 99:1 to 0:100.

9. A method for preparing a cerium oxide powder comprising the step of sintering the cerium carbonate powder of claim 8.

10. The method according to claim 9, wherein the sintering is conducted at a temperature of from 600 to 1200° C. for 30 minutes to 4 hours.

11. CMP slurry comprising the cerium oxide powder prepared by the method of claim 9 as an abrasive.

12. The method according to claim 6, wherein the cerium precursor is a cerium salt comprising trivalent or tetravalent cerium.

13. The method according to claim 12, wherein the cerium salt is selected from the group consisting of cerium nitrate $(Ce(NO_3)_3 \cdot xH_2O)$, cerium sulfate$(Ce(SO_4)_3 \cdot xH_2O$ or $Ce(SO_4)_2 \cdot xH_2O)$, cerium chloride $(CeCl_3 \cdot xH_2O)$ or diammonium cerium nitrate$(Ce(NH_4)_2(NO_3)_6$ and $Ce(NH_4)_2(NO_3)_5 \cdot xH_2O)$ (wherein, x is constant of from 0 to 10).

14. The method according to claim 6, wherein the carbonate precursor is urea or carbonate salt.

TABLE 2

| Cerium oxide | Crystal structure of cerium carbonate powder | Silicon oxide film polishing rate (Å/nm) | Silicon nitride film polishing rate (/min) | selectivity | Delta WIWNU (%) |
| --- | --- | --- | --- | --- | --- |
| example 1 & 4 | Hexagonal (100 vol %) | 3444 | 96 | 36 | 7.11 |
| example 2 & 3 | Orthorhombic (40 vol %)/Hexagonal (60 vol %) | 3321 | 119 | 28 | 13.22 |
| Comparative example 1 | Orthorhombic | 3167 | 122 | 26 | 15.28 |
| Comparative example 2 | Orthorhombic | 3264 | 116 | 28 | 16.77 |

From the Table 2, it was confirmed that since cerium carbonate powders having different ratios of orthorhombic cerium carbonate and hexagonal cerium carbonate have different kinds and shapes, cerium oxide powders and CMP slurry prepared therefrom show different polishing performances.

* * * * *